(12) United States Patent
Miller et al.

(10) Patent No.: US 7,829,366 B2
(45) Date of Patent: Nov. 9, 2010

(54) MICROELECTROMECHANICAL SYSTEMS COMPONENT AND METHOD OF MAKING SAME

(75) Inventors: Melvy F. Miller, Tempe, AZ (US);
Daniel N. Koury, Jr., Mesa, AZ (US);
Lianjun Liu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 198 days.

(21) Appl. No.: 12/040,737

(22) Filed: Feb. 29, 2008

(65) Prior Publication Data
US 2009/0218642 A1 Sep. 3, 2009

(51) Int. Cl.
*H01L 21/00* (2006.01)
(52) U.S. Cl. ............... 438/53; 438/51; 257/E31.113; 257/E31.124
(58) Field of Classification Search .......... 438/51, 438/53; 257/414–416
See application file for complete search history.

(56) References Cited

U.S. PATENT DOCUMENTS

| | | | |
|---|---|---|---|
| 5,998,243 A | 12/1999 | Odashima et al. | |
| 6,500,731 B1 | 12/2002 | Nakagawa et al. | |
| 6,613,678 B1 | 9/2003 | Sakaguchi et al. | |
| 6,967,362 B2 | 11/2005 | Nam et al. | |
| 7,019,955 B2 | 3/2006 | Loeb et al. | |
| 7,202,552 B2 | 4/2007 | Zhe et al. | |
| 7,217,588 B2 | 5/2007 | Hartzell et al. | |
| 7,232,743 B2 | 6/2007 | Aulnette et al. | |
| 7,233,679 B2 | 6/2007 | Muthuswamy et al. | |
| 2001/0033670 A1* | 10/2001 | Tai et al. ............... | 381/174 |
| 2005/0103112 A1* | 5/2005 | Pedersen et al. ........ | 73/718 |
| 2005/0254673 A1* | 11/2005 | Hsieh et al. ............ | 381/175 |
| 2006/0169049 A1* | 8/2006 | Matsubara ............. | 73/754 |
| 2007/0040231 A1 | 2/2007 | Harney et al. | |
| 2007/0058825 A1* | 3/2007 | Suzuki et al. .......... | 381/174 |
| 2007/0092983 A1 | 4/2007 | Weigold | |
| 2007/0165888 A1* | 7/2007 | Weigold ................ | 381/174 |
| 2007/0201709 A1* | 8/2007 | Suzuki et al. .......... | 381/174 |
| 2008/0053236 A1* | 3/2008 | Gogoi et al. ........... | 73/718 |

OTHER PUBLICATIONS

Martin et al.,Development of a MEMS Dual Backplate Capacitive Microphone for Aeroacoustic Measurements, American Institute of Aeronautics and Astronautics, downloaded Nov. 15, 2007, University of Florida, Gainesville, Florida 32611.
International Search Report and Written Opinion correlating to U.S. Appl. No. 12/040,737, PCT/US2009/031207, dated Apr. 17, 2009.

(Continued)

*Primary Examiner*—A. Sefer
(74) *Attorney, Agent, or Firm*—Meschkow & Gresham, P.L.C.

(57) ABSTRACT

A microelectromechanical systems (MEMS) component 20 includes a portion 32 of a MEMS structure 30 formed on a semiconductor substrate 34 and a portion 36 of the structure 30 formed in a non-semiconductor substrate 22. The non-semiconductor substrate 22 is in fixed communication with the semiconductor substrate 34 with the portion 32 of the MEMS structure 30 being interposed between the substrates 34 and 22. A fabrication method 96 entails utilizing semiconductor thin-film processing techniques to form the portion 32 on the semiconductor substrate 34, and utilizing a lower cost processing technique to fabricate the portion 36 in the non-semiconductor substrate 22. The portions 32 and 36 are coupled to yield the MEMS structure 30, and the MEMS structure 30 can be attached to another substrate as needed for additional functionality.

10 Claims, 7 Drawing Sheets

OTHER PUBLICATIONS

Hsieh, W.H. et al., "A micromachined thin-film Teflon electret microphone" In: Solid State Sensors and Actuators, 1997 International Conference. Jun. 1997, pp. 425-428.

Martin, D.T. et al. "A Micromachined Dual-Backplate Capacitive Microphone for Aeroacoustic Measurements", Journal of Microelectromechanical Systems. vol. 16, Dec. 2007, pp. 1289-1302.

Liu, J. et al. Nonlinear model and system identification of a capacitive dual-backplate MEMS microphone. Journal of Sound and Vibration. Abstract.

* cited by examiner

MICROELECTROMECHANICAL SYSTEMS COMPONENT AND METHOD OF MAKING SAME

TECHNICAL FIELD OF THE INVENTION

The present invention relates generally to microelectromechanical systems (MEMS) components. More specifically, the present invention relates to a MEMS component and method of making the MEMS component using low cost materials.

BACKGROUND OF THE INVENTION

Microelectromechanical systems (MEMS) components are increasingly being used in a wide variety of applications, especially where the demand for miniaturized structures is called for. Typically, a MEMS component is a miniaturized device having a movable structure suspended from a substrate, and associated circuitry that both senses movement of the suspended structure and delivers the sensed movement data to one or more external devices for processing. MEMS devices can be implemented as accelerometers to selectively deploy air bags in automobiles, as gyroscopes to detect rotation rates in airplanes, as microphones to convert audible signals to electrical signals, and so forth. The use of MEMS microphones, rather than conventional electret-condenser microphones, has come to be appreciated for their small package profile and compatibility with surface mount techniques and automated pick-and-place equipment.

MEMS components are typically fabricated on semiconductor wafers using one of two well established techniques: bulk micromachining or surface micromachining. In both of these techniques, the MEMS component is fabricated in or on a semiconductor wafer using standard integrated circuit fabrication equipment. Once the wafer is processed, it is diced to form individual die. Each singulated die is packaged, and the MEMS component may be inserted into a socket or bonded to a non-semiconductor substrate, such as a printed circuit board as part of an overall system.

MEMS fabrication and packaging can have a significant impact on the ability of such MEMS components to penetrate cost-sensitive markets, such as the cellular telephone industry. Thus, what is needed is a lower cost system solution compatible with robust assembly in order to further promote the use of MEMS components.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

A microelectromechanical systems (MEMS) component includes a MEMS structure and often one or more electronic circuits that together form a microsystem, or system-in-package. Methodology of the present invention entails processing a portion of the MEMS structure on a standard semiconductor substrate using thin-film processing techniques and fabricating another portion of the MEMS structure on a low cost, non-semiconductor substrate, such as polymer, laminate, and so forth. The two substrates are bonded together to complete MEMS structure fabrication. Process steps that produce elements of critical dimensions and that occur at higher temperature are implemented on the semiconductor substrate, and some thin-film process steps are moved to the lower cost non-semiconductor substrate wherever feasible. The resulting combination of substrates can be readily implemented to form a more cost effective dual substrate MEMS structure that may be utilized as an element in a MEMS system-in-package configuration.

Figure 1:
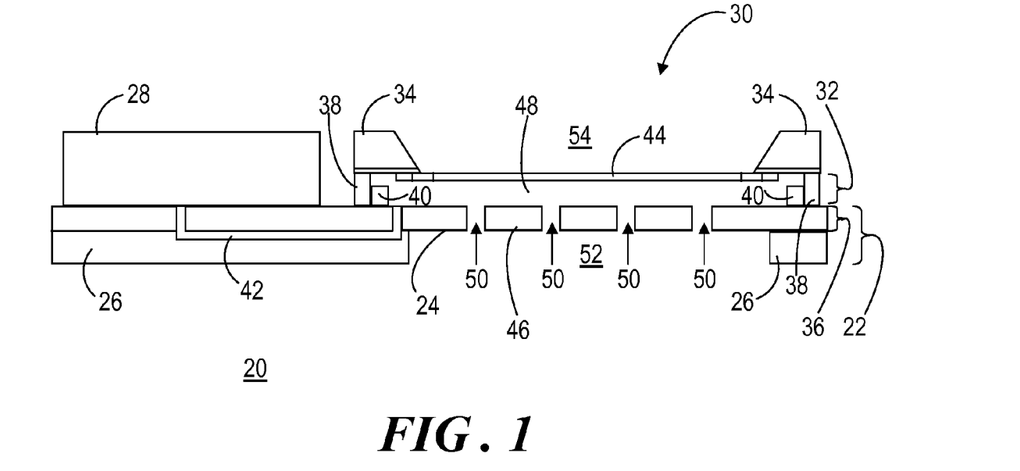
FIG. 1 schematically shows a side view of a microelectromechanical systems (MEMS) component in accordance with an embodiment of the present invention.

FIG. 1 schematically shows a side view of a microelectromechanical systems (MEMS) component 20 in accordance with an embodiment of the present invention. MEMS component 20 includes a non-semiconductor substrate 22 having a region 24 coupled with, or integrally formed with, another region 26. In this instance, region 24 of non-semiconductor substrate is attached to region 26 of non-semiconductor substrate 22 in a stacked configuration. An electrical circuit 28 is formed on or otherwise coupled to region 24 of non-semiconductor substrate 22. Electrical circuit 28 may be an application specific integrated circuit (ASIC), a microprocessor, communications components, and so forth.

MEMS component 20 further includes a MEMS structure 30. MEMS structure 30 includes a portion 32 formed on a semiconductor substrate 34, for example, a silicon wafer, utilizing thin-film processing techniques. Another portion 36 of MEMS structure 30 is formed in region 24 of non-semiconductor substrate 22. A spacer 38 and a seal 40 may be used to attach portion 32 of MEMS structure 30 in fixed communication with portion 36 of MEMS structure 30. In other words, spacer 38 is used to attach, or fix, portion 32 with portion 36 in an unchanging, predetermined position. Spacer 38 and seal 40 form a perimeter that may or may not completely surround MEMS structure 30. Spacer 38 is sized to set the separation between portions 32 and 36 of MEMS structure 30. Seal 40 can function to protect MEMS structure 30, provide electrical connections, and shield MEMS structure from electromagnetic interference.

Electrical circuit 28 is in electrical communication with MEMS structure 30. The term "electrical communication" refers to at least one electrical signal that is carried between electrical circuit 28 and MEMS structure 30 by means of, for example, a conductive trace. For example, MEMS structure 30 may be connected via an interlevel trace 42 to electrical circuit 28. Interlevel trace 42 may carry one or more electrical signals between MEMS structure 30 and electrical circuit 28 and/or MEMS structure 30 and electrical circuit 28 may merely share common DC voltages and grounds. In another embodiment, MEMS structure 30 and electrical circuit 28 may be in electrical communication using a wire bonding technique.

Only one electrical circuit 28, MEMS structure 30, and interlevel trace 42 is shown in MEMS component 20 for simplicity of illustration. Those skilled in the art will recognize that MEMS component 20 may include more than one electrical circuit, more than one MEMS structure, multiple interlevel and surface traces, and so forth in accordance with the particular system-in-package design requirements for MEMS component 20.

In an exemplary embodiment, MEMS component 20 is a MEMS microphone. Thus, the MEMS component will be referred to hereinafter as MEMS microphone 20. It should become apparent, however, that the present invention is not limited to MEMS microphones. Rather, aspects of the present invention may be readily implemented in accordance with various MEMS components and MEMS device packages.

Portion 32 of MEMS structure 30 includes a diaphragm 44 and portion 36 of MEMS structure 30 includes an electrode, or plate 46. Diaphragm 44 represents a flexible planar structure of a thickness sufficient to enable its flexure, or movement, in the presence of sound waves. In contrast, plate 46 represents a planar structure that is less flexible than diaphragm 44. Diaphragm 44 and plate 46 are separated by an air gap 48. In general, diaphragm 44 is a movable plate and plate 46 is a "fixed" plate (i.e., moving substantially less than diaphragm 44) of a variable capacitor of MEMS microphone 20. Thus, diaphragm 44 and plate 46 act as electrodes for a capacitive circuit. As shown, holes 50 may be created in plate 46 of region 24 of non-semiconductor substrate 22 to allow sound waves to reach diaphragm 44. Alternatively, or additionally, sound waves can be made to reach diaphragm 44 through other channels. In any case, sound waves cause diaphragm 44 to vibrate, and the vibrations can be sensed as changes in capacitance between diaphragm 44 and plate 46. Electrical circuit 28 may convert this changing capacitance into electrical signals that can be further processed.

Holes 50 in region 24 of non-semiconductor substrate 22 lead to an acoustic cavity 52 of MEMS microphone 20. Thus, plate 46 is interposed between diaphragm 44 and acoustic cavity 52. In FIG. 1, acoustic cavity 52 is formed in region 26 of non-semiconductor substrate 22. MEMS structure 30 further includes a cavity 54 behind diaphragm 44 which exposes diaphragm 44 and allows it to deflect freely in response to sound waves. Cavity 54 may be formed during processing of portion 32 of MEMS structure 30 by etching or otherwise removing at least a section of substrate 34 (discussed below). The fabrication methodology for making MEMS microphone 20 using a combination of semiconductor thin-film processing techniques and a lower cost non-semiconductor processing technique will be discussed in connection with FIG. 3.

Figure 2:
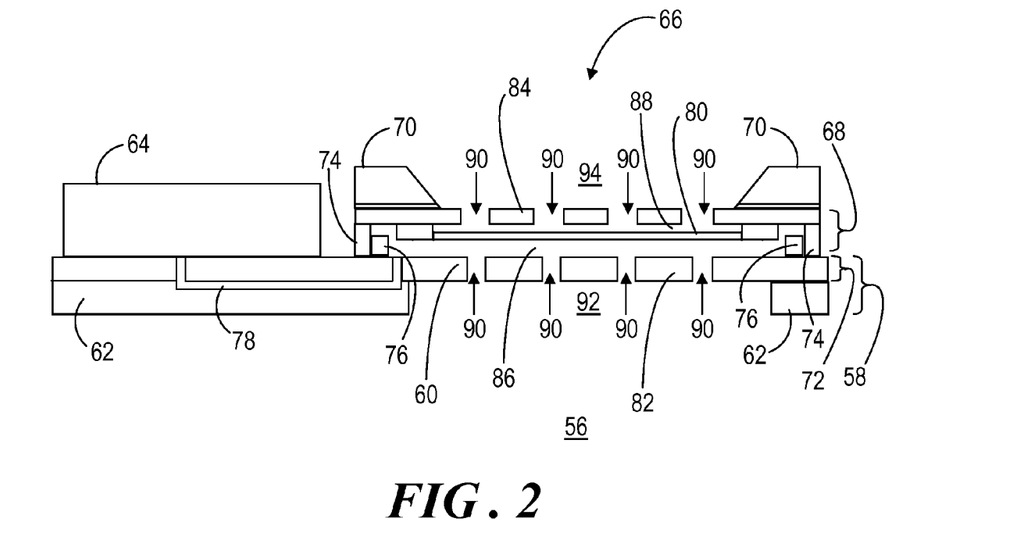
FIG. 2 schematically shows a side view of a differential capacitor MEMS component in accordance with another embodiment of the present invention.

FIG. 2 schematically shows a side view of a differential capacitor MEMS component 56 in accordance with another embodiment of the present invention. Differential capacitor MEMS component is a dual plate MEMS design that forms a MEMS microphone. Thus, the differential capacitor MEMS component will be referred to hereinafter as differential capacitor MEMS microphone 56 or, for brevity, MEMS microphone 56. The implementation of the dual plate design of MEMS microphone 56 can have certain advantages over the single plate design of MEMS microphone 20. These advantages include, for example, approximately twice the sensitivity of a comparable single plate design, the use of higher bias voltages is possible, and higher bandwidth via closed loop force feedback. The primary tradeoff is typically a more complicated fabrication process. However, like MEMS microphone 20, fabrication methodology for making differential capacitor MEMS microphone 56 entails the use of a combination of a thin-film and lower cost processing techniques discussed in connection with FIG. 3.

MEMS microphone 56 includes a low cost, non-semiconductor substrate 58 (e.g., polymer, laminate, etc.) having a region 60 coupled with another region 62, or formed integrally with region 62. An electrical circuit 64 is formed on or otherwise coupled to region 60 of non-semiconductor substrate 58. MEMS microphone 56 further includes a MEMS structure 66. In accordance with the present invention, MEMS structure 66 includes a portion 68 formed on a semiconductor substrate 70, for example, a silicon wafer, utilizing thin-film processing techniques. Another portion 72 of MEMS structure 66 is formed in region 60 of non-semiconductor substrate 58. A spacer 74 and a seal 76 may be used to attach portion 68 of MEMS structure 56 in fixed communication with portion 72 of MEMS structure 58. Spacer 74 and seal 76 form a perimeter that may or may not completely surround MEMS structure 66. Spacer 74 is sized to set the separation between portions 68 and 72 of MEMS structure 66. Seal 76 can function to protect MEMS structure 66, provide electrical connections, and shield MEMS structure from electromagnetic interference.

Like electrical circuit 28 (FIG. 1), electrical circuit 64 is in electrical communication with MEMS structure 66 via, for example, an interlevel trace 78, or as mentioned above, using conventional wire bonding techniques. Interlevel trace 78 may carry one or more electrical signals between MEMS structure 66 and electrical circuit 64 and/or MEMS structure 66 and electrical circuit 64 may merely share common dc voltages and grounds. Again, only one electrical circuit 64, MEMS structure 66, and interlevel trace 78 is shown in MEMS microphone 56 for simplicity of illustration. Those skilled in the art will recognize that MEMS microphone 56 may include more than one electrical circuit, more than one MEMS structure, multiple interlevel and surface traces, and so forth in accordance with the particular system-in-package design requirements for MEMS microphone 56.

Portion 68 of MEMS structure 66 includes a diaphragm 80 and portion 72 of MEMS structure 66 includes an electrode, or plate 82. MEMS structure 66 further includes a third portion, formed as another plate 84 of MEMS microphone 56. Plate 84 is interposed between diaphragm 80 and substrate 70, and is fabricated in accordance with a semiconductor thin-film processing techniques, discussed below. Thus, diaphragm 80 is located between plates 82 and 84. Diaphragm 80 and plate 82 are separated by an air gap 86. Similarly, diaphragm 80 and plate 84 are separated by an air gap 88. In this configuration, diaphragm 80 is a movable plate, and each of plates 82 and 84 are "fixed" plates of a pair of variable capacitors of dual plate MEMS microphone 56. Thus, diaphragm 80, plate 82, and plate 84, act as electrodes for a capacitive circuit.

As shown, each of plates 82 and 84 has holes 90 that allow sound waves to reach and deflect diaphragm 80 and/or for pressure equalization. Holes 90 in plate 82 of region 60 of non-semiconductor substrate 58 lead to an acoustic cavity 92 so that plate 82 is interposed between diaphragm 80 and acoustic cavity 92. Acoustic cavity 92 is formed in region 62 of non-semiconductor substrate 58. MEMS structure 66 further includes a cavity 94 behind plate 84 that allows for the deflection of diaphragm 80 in response to sound waves. Cavity 94 may be formed during processing of diaphragm 80 and plate 84 by etching or otherwise removing at least a section of substrate 70 (discussed below).

In an alternative embodiment, region 60 of non-semiconductor substrate 58 need not be included. Rather, portion 68 of MEMS structure 66 may attach directly to region 62 of non-semiconductor substrate 58 in the vicinity of acoustic cavity 92. In this alternative embodiment, the resulting MEMS structure would be a single plate capacitive sensor with diaphragm 80 and plate 84 acting as electrodes for the capacitive circuit. Acoustic cavity 92, formed as an opening through region 62 of non-semiconductor substrate 58, would remain as a portion of MEMS structure 66 for the purpose of enabling sound waves to reach diaphragm 80.

Figure 3:
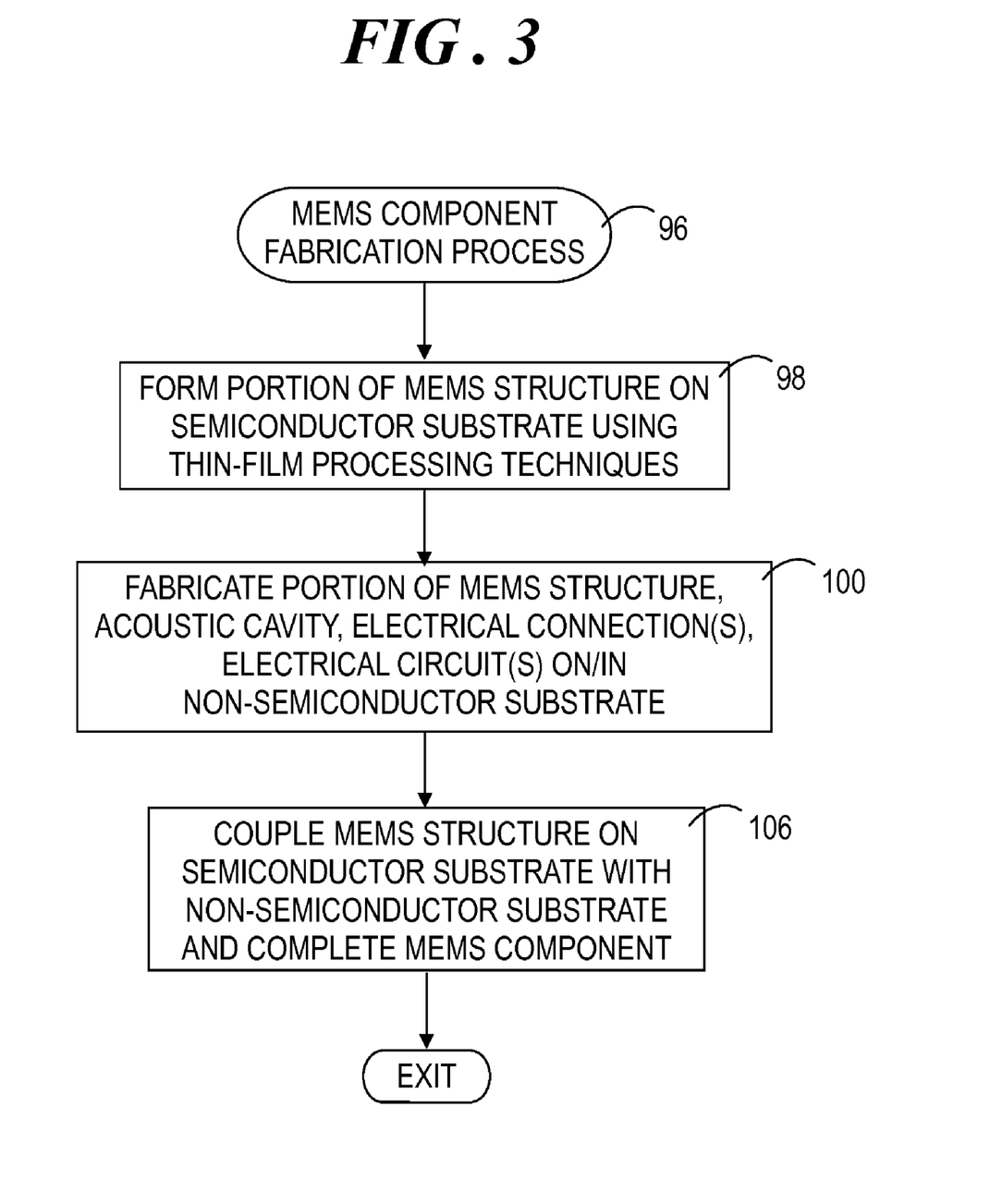
FIG. 3 shows a flowchart of a MEMS component fabrication process in accordance with the present invention.

FIG. 3 shows a flowchart of a MEMS component fabrication process 96 in accordance with the present invention. MEMS component fabrication process 96 combines the features of semiconductor thin-film processing techniques and lower cost non-semiconductor processing techniques to form MEMS components, such as MEMS microphone 20 (FIG. 1) and differential capacitor MEMS microphone 56 (FIG. 2). Process 96 will be discussed in connection with the fabrication of the dual plate design of differential capacitor MEMS microphone 56. Accordingly, reference should be made to FIG. 2 in connection with the following discussion of FIG. 3. However, it should become apparent that the following methodology can be adapted to fabricate the single plate design of MEMS microphone 20 and/or other MEMS component designs in which a portion of the MEMS component is fabricated on a silicon wafer substrate utilizing a thin-film processing technique, and another portion of the MEMS component is fabricated in a non-semiconductor substrate, such as a polymeric material or printed circuit board (PCB), utilizing a lower cost non-semiconductor processing technique.

Fabrication process 96 is described below in connection with the fabrication of a single MEMS microphone 56 for simplicity of illustration. However, it should be understood by those skilled in the art that the following process allows for concurrent manufacturing of a plurality of MEMS microphones 56. For example, multiple portions of MEMS structure 66 may undergo concurrent semiconductor thin-film manufacturing on semiconductor substrate 70. The individual portions of MEMS microphones 56 can then be cut, or diced, in a conventional manner to provide individual portions of MEMS microphones 56 that can be coupled with region 60 of non-semiconductor substrate 58 to form individual MEMS structures 66. These individual MEMS structures 66 can subsequently be combined with region 62 of non-semiconductor substrate 58 and electrical circuit 64 to complete dual plate MEMS microphone 56.

MEMS component fabrication process 96 begins with a task 98. At task 98, a portion of MEMS structure 66 is formed on a semiconductor wafer using thin-film processing techniques in accordance with known MEMS fabrication processes. These MEMS fabrication processes include, for example, deposition processes, photolithography, wet and dry etching processes, and the like. In this exemplary scenario, diaphragm 80 and plate 84 of MEMS structure 66 are fabricated on semiconductor substrate 70. Semiconductor thin-film processing techniques are discussed in connection with FIGS. 4-8.

Next, a task 100 is performed. At task 100, another portion of MEMS structure 66 is formed in non-semiconductor substrate 58. In this example, plate 82 of MEMS structure 66 is fabricated in region 60 of non-semiconductor substrate 58 utilizing lower cost materials and methodologies. In addition, region 62 of non-semiconductor substrate 58 is fabricated to include an opening for acoustic cavity 92, electrical connections, e.g., interlevel trace 78, and electrical circuits, e.g., electrical circuit 64. Fabrication may entail various process steps of non-semiconductor manufacturing, for example, printed circuit board manufacture. These process steps may include the creation of holes 90 in plate 82 and the creation of acoustic cavity 92 by etching, drilling, punching, and so forth. They may also include patterning and etching, lamination to produce interlevel trace 78, exposed conductor plating and coating, solder resist, screen printing, test, populating with electrical circuit 64, and so forth. It should be noted that task 98 pertains to using semiconductor thin-film processing techniques, and task 100 pertains to using non-semiconductor processing techniques. Accordingly, although they are described herein as being serial operations for simplicity, these distinct processes may be performed in parallel in separate areas of a single manufacturing facility or these distinct processes may be performed at different manufacturing facilities.

Process 96 continues with a task 106. At task 106, region 60 containing plate 82 of non-semiconductor substrate 58 is coupled with semiconductor substrate 70 using spacer 74 and seal 76 to form MEMS structure 66. Accordingly, task 106 is a component population task in which the PCB fabricated at task 100 is populated with diaphragm 80 and plate 84 of MEMS structure 66. Task 106 may further include activities associated with the completion of MEMS microphone 56 including attaching MEMS structure 66 to region 62 of non-semiconductor substrate 58, completing electrical connections, testing, conformal coating and the like as the MEMS component design dictates. Following task 106, MEMS component fabrication process 96 exits. The attachment task 106 will be discussed in further detail in connection with FIGS. 9 and 10.

As mentioned briefly above, a portion of MEMS structure 66 is fabricated on substrate 70 utilizing semiconductor thin-film processing techniques. Semiconductor thin-film processes can be known or upcoming techniques for the fabrication of MEMS structures. Semiconductor thin-film processes can effectively be employed to control thin film thickness and uniformity (diaphragm thickness and diaphragm to plate air gap). An exemplary thin-film processing sequence of task 98 is discussed below in connection with FIGS. 4-8.

Figure 4:
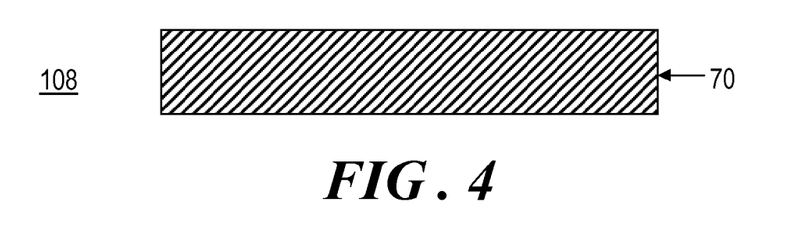
FIG. 4 shows a side view of the device of FIG. 2 in a beginning stage of processing.

FIG. 4 shows a side view of MEMS microphone 56 (FIG. 2) in a beginning stage 108 of processing in accordance with task 98 of MEMS component fabrication process 96 (FIG. 3). At beginning stage 108, semiconductor substrate 70, such as a silicon wafer, is provided.

Figure 5:
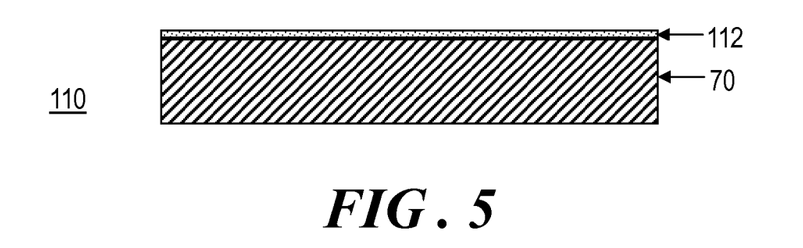
FIG. 5 shows a side view of the device of FIG. 4 in a subsequent stage of processing.

FIG. 5 shows a side view of the device of FIG. 4 in a subsequent stage 110 of processing. At stage 110, a blanket sacrificial layer 112, for example, phosphosilicate glass (PSG) is deposited on semiconductor substrate 70.

Figure 6:
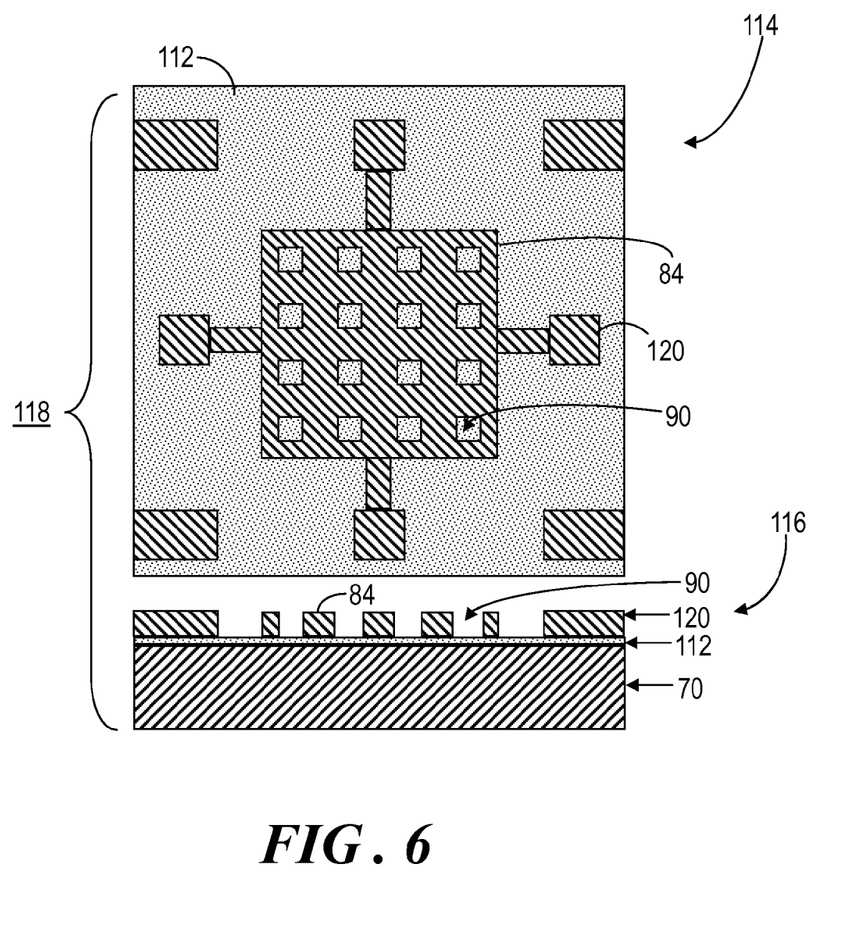
FIG. 6 shows a top and a side view of the device of FIG. 5 in a subsequent stage of processing.

FIG. 6 shows a top view 114 and a side view 116 of the device of FIG. 5 in a subsequent stage 118 of processing. At stage 118, a polysilicon layer 120 is deposited on sacrificial layer 112 to be used to form plate 84. Polysilicon layer 120 is patterned and etched, and electrically conducting interconnects can be included as necessary. As shown, polysilicon layer 120 is patterned and etched to form openings 90 of plate 84.

Figure 7:
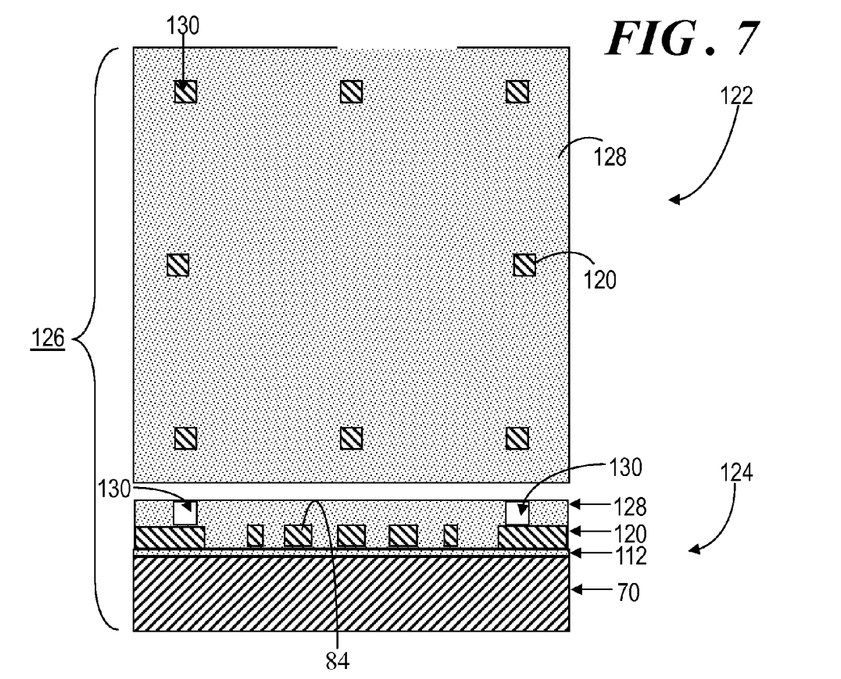
FIG. 7 shows a top and a side view of the device of FIG. 6 in a subsequent stage of processing.

FIG. 7 shows a top view 122 and a side view 124 of the device of FIG. 6 in a subsequent stage 126 of processing. At stage 126, another sacrificial layer 128, of for example, PSG, is deposited on polysilicon layer 120 encapsulating plate 84. Sacrificial layer 128 may be patterned for vias 130 as needed.

Figure 8:
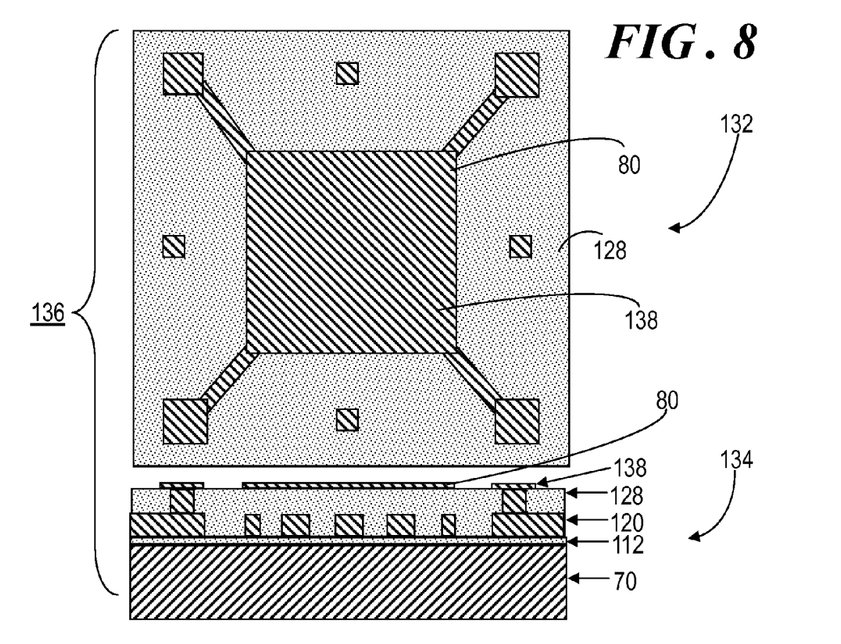
FIG. 8 shows a top and a side view of the device of FIG. 7 in a subsequent stage of processing.
Figure 11:
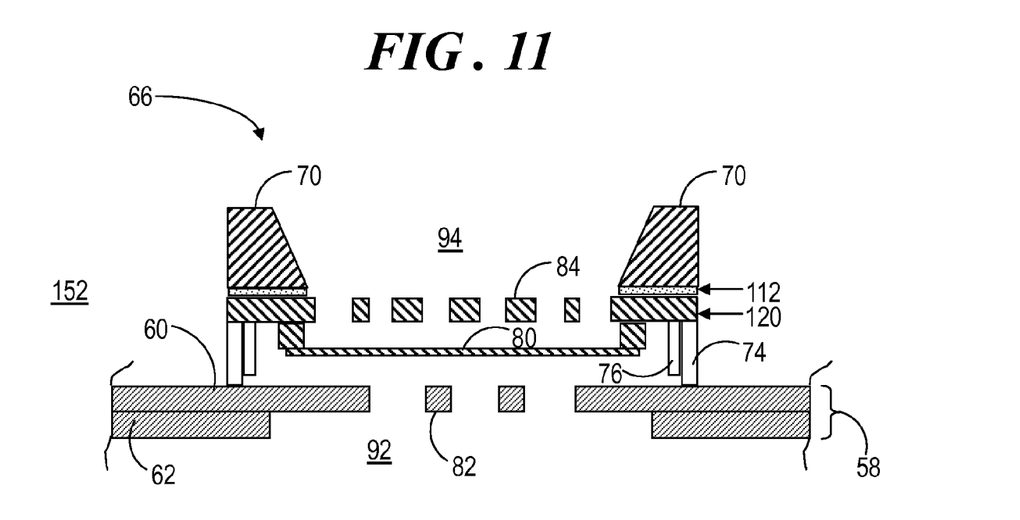
FIG. 11 shows a side view of the device of FIG. 10 in a subsequent stage of processing.

FIG. 8 shows a top view 132 and a side view 134 of the device of FIG. 7 in a subsequent stage 136 of processing. At stage 136, another polysilicon layer 138 is deposited on sacrificial layer 128 to be used to form diaphragm 80. Deposition of polysilicon layer 138 can additionally cause the filling of vias 130. Polysilicon layer 138 is patterned and etched, and interconnects can be included as necessary. As shown, the patterning and etching of polysilicon layer 138 results in the formation of diaphragm 80 secured at its corners to enable its movement. The described processing methodology results in the formation of a relatively thicker plate 84 overlying diaphragm 80 when the device is flipped, as shown in FIG. 11. In other embodiments, it may be desirable to deposit relatively thinner underlying layers prior to deposition of relatively thicker overlying layers, which result in a thinner planar surface overlying a thicker planar surface when the device is flipped.

Figure 9:
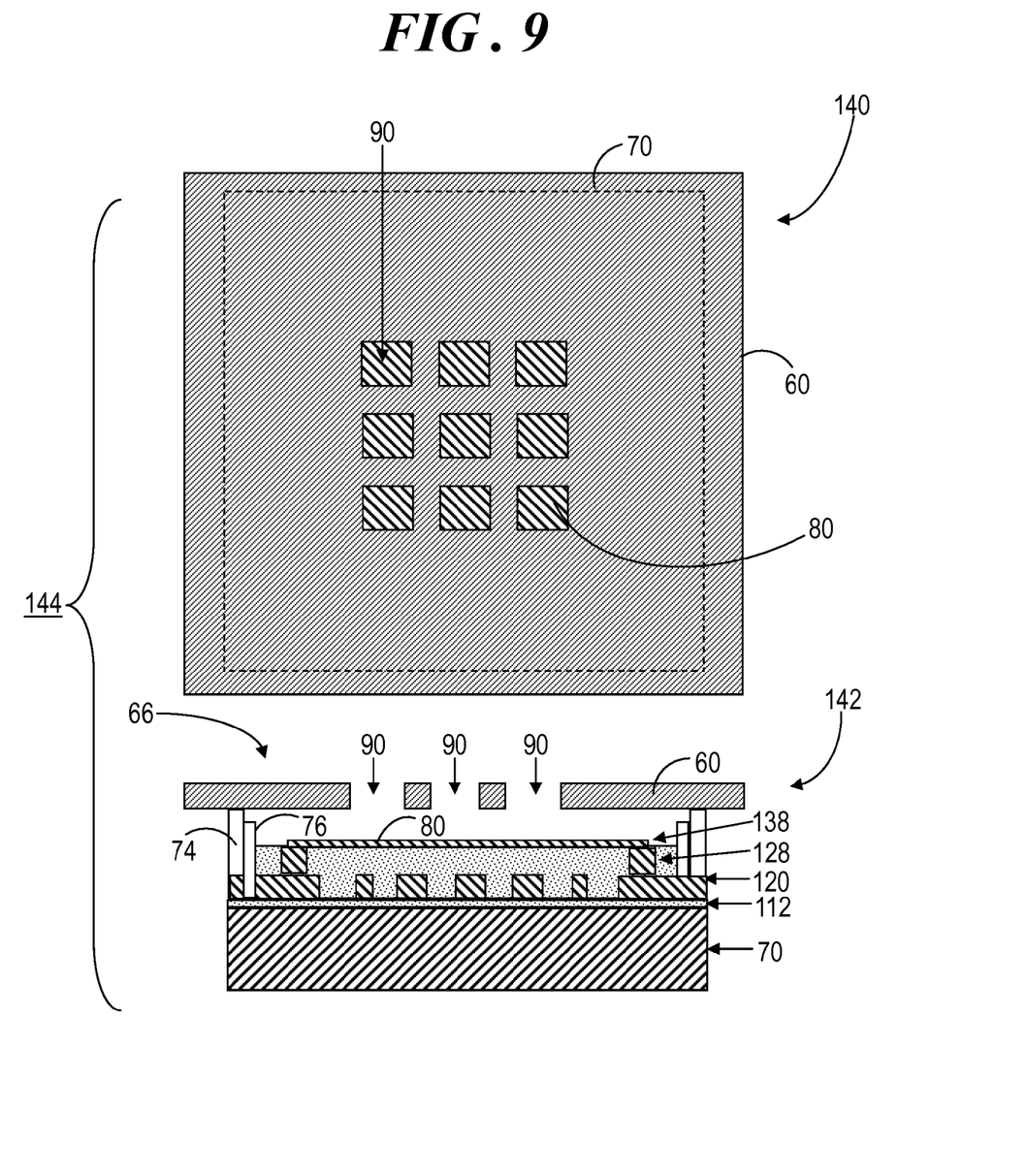
FIG. 9 shows a top and a side view of the device of FIG. 8 in a subsequent stage of processing.
Figure 10:
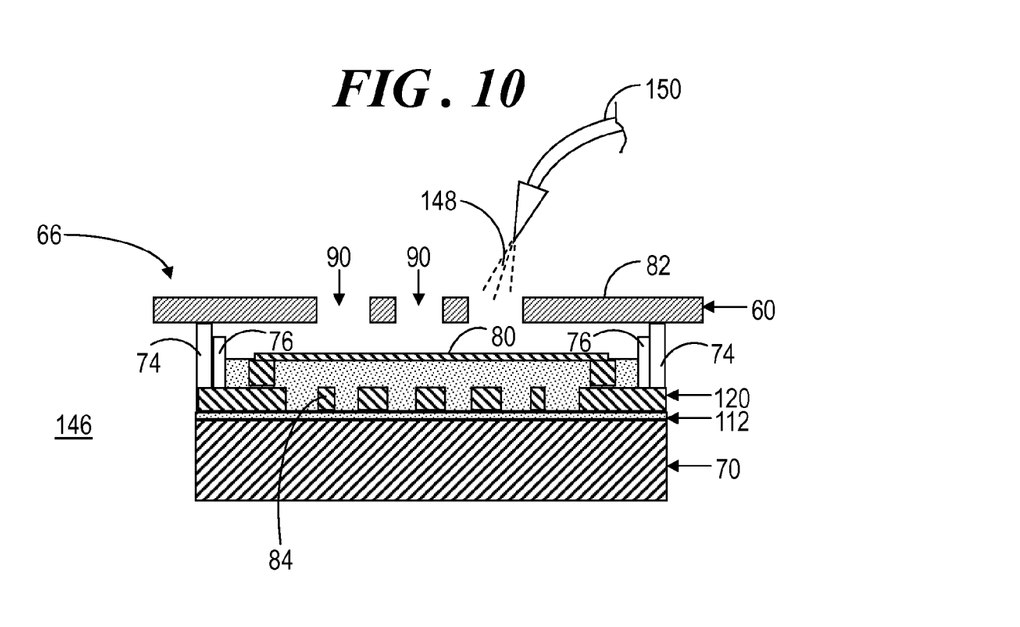
FIG. 10 shows a side view of the device of FIG. 9 in a subsequent stage of processing.

FIGS. 9-10 will now be discussed. The processing stages illustrated in FIGS. 9-10 correspond to the operations taking place in connection with task 106 (FIG. 3) of MEMS component fabrication process 96 (FIG. 3) at which semiconductor substrate 70 is coupled with region 60 of non-semiconductor substrate 58 to form MEMS structure 66 (FIG. 2).

FIG. 9 shows a top view 140 and a side view 142 of the device of FIG. 8 in a subsequent stage 144 of processing. As shown, region 60 of non-semiconductor substrate 58 has been pre-drilled to include holes 90. Non-semiconductor substrate 58 at region 60 is coupled to substrate 70 utilizing spacer 74 and seal 76. As shown in top view 140, region 60 overlies substrate 70 (represented as dashed lines). It should be noted that diaphragm 80 and plate 84 are in a currently unreleased state. That is, sacrificial layer 128 has not yet been removed from MEMS structure 66. Non-semiconductor region 60 is desirably porous to an etch material, or etchant. In the embodiment shown, this porosity is accomplished through the inclusion of holes 90 through which an etchant can pass to reach the underlying sacrificial layer 128. However, in alternate embodiments, this porosity may be accomplished by the properties of the material used to fabricate region 60 of non-semiconductor substrate 58. For example, the properties of the material used to fabricate region 60 are such that the etchant can permeate through the material of region 60 to reach the underlying sacrificial layer 128 without damage to region 60.

FIG. 10 shows a side view of the device of FIG. 9 in a subsequent stage 146 of processing. At stage 146, an etchant 148 is applied via holes 90 of plate 82, utilizing conventional equipment 150. Etchant 148 functions to release diaphragm 80 and plate 84 to make a free-standing microphone. Although application of etchant 148 is discussed in connection with its application following attachment of non-semiconductor region 60 with semiconductor substrate 70, it should be understood that in another embodiment, etchant 148 may be applied prior to attachment of non-semiconductor region 60 with semiconductor substrate 70.

FIG. 11 shows a side view of the device of FIG. 10 in a subsequent stage 152 of processing. At stage 152, region 60 of non-semiconductor substrate 58 has been attached to region 62 of non-semiconductor substrate 58. In addition, semiconductor substrate 70 and a portion of sacrificial layer 112 have been etched or otherwise removed to fully release plate 84 and to create cavity 94 of MEMS structure 66. However, a portion of substrate 70 remains to retain the stiffness afforded by semiconductor substrate 70. In addition, MEMS structure 66 is flipped over.

Figure 12:
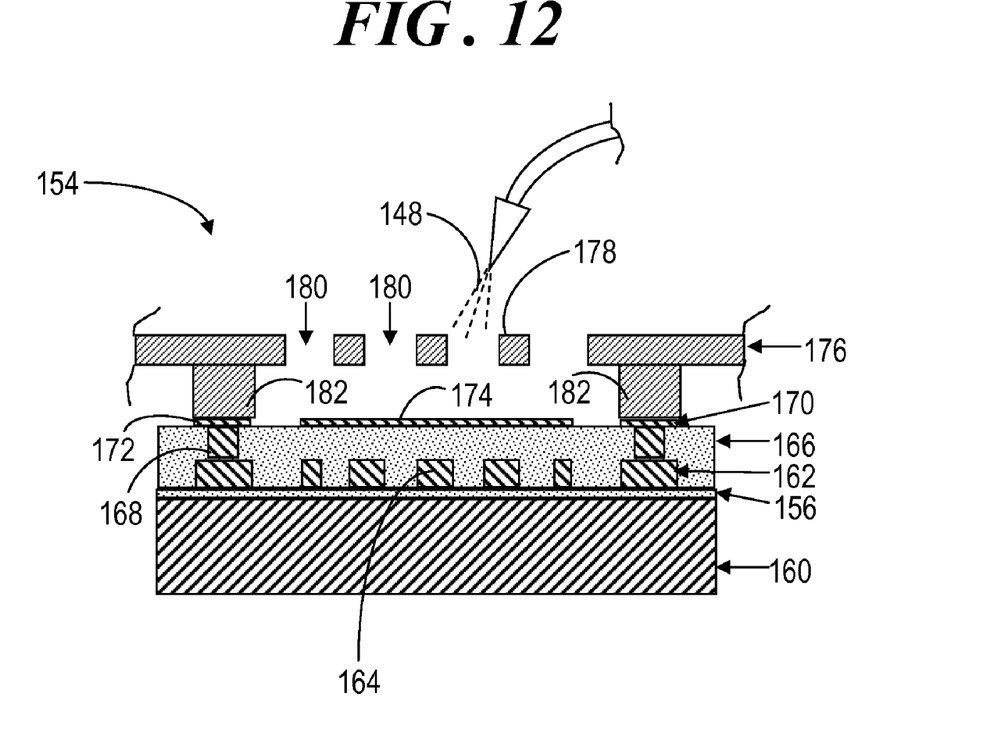
FIG. 12 shows a side view of the MEMS component and a later stage of fabrication in accordance with another embodiment of the present invention.

FIG. 12 shows a side view of a MEMS structure 154 and a later stage of fabrication in accordance with another embodiment of the present invention. Like MEMS structure 66, the semiconductor thin-film processing portion of MEMS structure 154 is fabricated as discussed above in connection with task 98 (FIG. 3) of MEMS component fabrication process 96 (FIG. 3). As such, the thin-film processed portion of MEMS structure 154 includes a sacrificial layer 156 deposited over a semiconductor substrate 160. A polysilicon layer 162 is deposited over sacrificial layer 156, and is patterned and etched to form a plate 164. Another sacrificial layer 166 is deposited over polysilicon layer 162, and vias 168 are formed in sacrificial layer 166. Another polysilicon layer 170 is then deposited over sacrificial layer 166 filling vias 168 to create pads 172. Polysilicon layer 170 is subsequently patterned and etched to form a diaphragm 174.

A non-semiconductor substrate of MEMS structure 154 includes a region 176 within which another plate 178 is formed by the use of judiciously drilled holes 180. In accordance with the alternative embodiment, a spacer 182 is formed as part of region 176. Spacer 182 can be bonded to pads 172 formed through the deposition of polysilicon layer 170. Such a structure removes the need for spacer 74 and seal 76 (FIG. 2) of MEMS microphone 56 (FIG. 2).

In this embodiment, etchant 148 is applied via holes 180 of plate 178. Etchant 148 functions to release diaphragm 174 and plate 164 to make a free-standing microphone. In addition, etchant 148 concurrently separates an entirety of semiconductor substrate 160 from fixed communication with region 176 of the non-semiconductor substrate through the removal of sacrificial layer 156.

Figure 13:
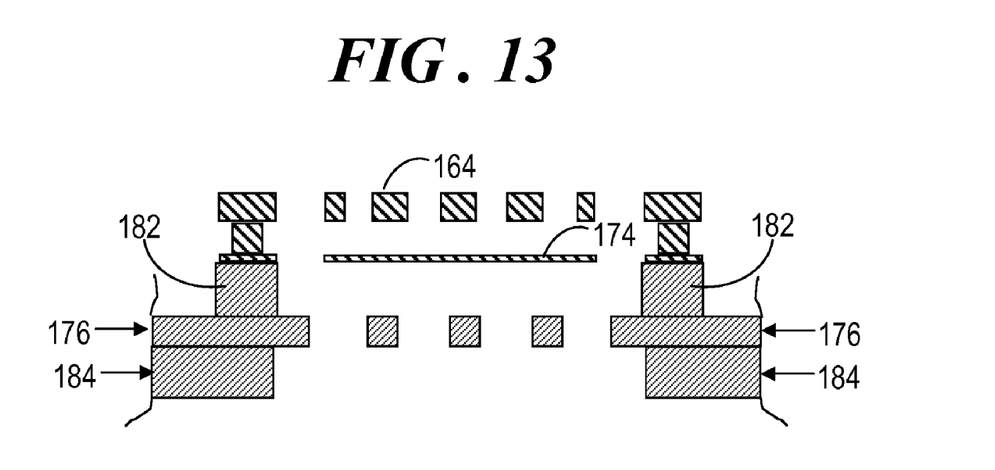
FIG. 13 shows a side view of the device of FIG. 12 further along in processing.

FIG. 13 shows a side view of MEMS structure 154 further along in processing. As particularly shown, semiconductor substrate 160 (FIG. 12) is completely removed leaving MEMS structure 154. MEMS structure 154 may subsequently form part of a MEMS microphone system-in-package configuration.

Once separated, semiconductor substrate 160 can be used as a starting material during another instance of MEMS structure fabrication or for other purposes. For a conventional MEMS microphone, it is necessary to etch completely through semiconductor substrate 160 to expose the diaphragm. The methodology discussed in connection with FIGS. 12-13 bypasses this requirement by delivering etchant 148 through holes 180 of plate 178. Holes 180 can be readily fabricated in the softer polymeric material of non-semiconductor portion 184 at a reduced cost relative to etching through semiconductor substrate 160. Additional cost savings is achieved through the reuse of substrate 160 for multiple batches of MEMS structures.

An embodiment described herein comprises a method of making a MEMS component that entails processing a portion of the MEMS structure on a standard semiconductor substrate using thin-film processing techniques and fabricating another portion of the MEMS structure on a lower cost, non-semiconductor substrate. In particular, part of the active MEMS structure is fabricated in the lower cost, non-semiconductor process technology, as opposed to fabricating the full MEMS structure using semiconductor thin-film processing and then attaching it to a non-semiconductor substrate. The present invention achieves cost reduction while producing a robust MEMS component by retaining thin-film processing for critical process steps in order to obtain, for example, uniform diaphragm thickness and diaphragm/plate air gap thickness, and moving some thin-film process steps to a lower-cost non-semiconductor fabrication process wherever feasible.

Although the preferred embodiments of the invention have been illustrated and described in detail, it will be readily apparent to those skilled in the art that various modifications may be made therein without departing from the spirit of the invention or from the scope of the appended claims. For example, fabrication of other MEMS structures such as accelerometers, pressure sensors, gyroscopes, and so forth may be implemented utilizing the dual substrate fabrication methodology described herein.

What is claimed is:

1. A method of making a microelectromechanical systems (MEMS) component comprising:
    depositing a sacrificial material layer on a semiconductor substrate;
    forming a portion of a MEMS structure on said sacrificial material layer utilizing semiconductor thin-film processing techniques;
    attaching a non-semiconductor substrate in fixed communication with said semiconductor substrate such that said portion of said MEMS structure is interposed between said semiconductor substrate and said non-semiconductor substrate, said non-semiconductor substrate being porous to an etchant; and
    removing at least a section of said semiconductor substrate from fixed communication with said non-semiconductor substrate, said removing operation comprising utilizing said etchant through said non-semiconductor substrate to release said portion of said MEMS structure from said sacrificial material layer.

2. A method as claimed in claim 1 wherein said portion is a first portion and said method further comprises utilizing said non-semiconductor substrate to form a second portion of said MEMS structure.

3. A method as claimed in claim 2 wherein said first portion and said second portion are capacitively coupled to form a movable plate and a fixed plate of a variable capacitor of said MEMS component.

4. A method as claimed in claim 2 further comprising creating through-holes in said non-semiconductor substrate leading to a cavity of said MEMS component such that said second portion of said MEMS structure is interposed between said first portion of said MEMS structure and said cavity.

5. A method as claimed in claim 4 wherein said non-semiconductor substrate is a first region of said non-semiconductor substrate, and said method further comprises:
    creating said cavity in a second region of said non-semiconductor substrate; and
    coupling said first region to said second region.

6. A method as claimed in claim 1 wherein said MEMS structure is a MEMS microphone, said portion of said MEMS structure includes a diaphragm, and said removing operation comprises exposing said diaphragm to enable deflection of said diaphragm.

7. A method as claimed in claim 1 wherein:
    said utilizing said etchant through said non-semiconductor substrate to release said MEMS structure from said sacrificial material layer concurrently separates an entirety of said semiconductor substrate from fixed communication with said non-semiconductor substrate through removal of said sacrificial material layer.

8. A method as claimed in claim 7 further comprising re-using said semiconductor substrate following separation of said entirety of said semiconductor substrate from fixed communication with said non-semiconductor substrate.

9. A method as claimed in claim 1 further comprising:
    providing an electrical circuit on said non-semiconductor substrate; and
    establishing electrical connections between said MEMS structure and said electrical circuit.

10. A method of making a microelectromechanical systems (MEMS) component comprising:
    forming a first portion of a MEMS structure on a semiconductor substrate utilizing semiconductor thin-film processing techniques, said forming said first portion of said MEMS structure including:
        fabricating a first conductive layer on said semiconductor substrate, said first conductive layer being a third portion of said MEMS structure;
        depositing a sacrificial material layer on said first conductive layer;
        fabricating a second conductive layer on said sacrificial material layer, said second conductive layer being said first portion of said MEMS structure; and
        utilizing an etchant to release said first and third portions of said MEMS structure;
    attaching a non-semiconductor substrate in fixed communication with said semiconductor substrate such that said first portion of said MEMS structure is interposed between said semiconductor substrate and said non-semiconductor substrate
    utilizing said non-semiconductor substrate to form a second portion of said MEMS structure; and
    removing at least a section of said semiconductor substrate from fixed communication with said non-semiconductor substrate, wherein following said attaching operation, said first portion of said MEMS structure is positioned between said second and third portions of said MEMS structure, and said first portion and said third portion are capacitively coupled to form a movable plate and a fixed plate of a variable capacitor of said MEMS component.

* * * * *